United States Patent
Subramanian et al.

(10) Patent No.: US 8,471,308 B2
(45) Date of Patent: Jun. 25, 2013

(54) PROCESS-VARIATION TOLERANT SERIES-CONNECTED NMOS AND PMOS DIODES, AND STANDARD CELLS, TAGS, AND SENSORS CONTAINING THE SAME

(75) Inventors: Vivek Subramanian, Orinda, CA (US); Patrick Smith, San Jose, CA (US)

(73) Assignee: Kovio, Inc., San Jose, CA (US)

( * ) Notice: Subject to any disclaimer, the term of this patent is extended or adjusted under 35 U.S.C. 154(b) by 11 days.

(21) Appl. No.: 13/047,627

(22) Filed: Mar. 14, 2011

(65) Prior Publication Data

US 2011/0234289 A1 Sep. 29, 2011

Related U.S. Application Data

(60) Division of application No. 12/424,509, filed on Apr. 15, 2009, now Pat. No. 7,932,537, which is a continuation of application No. 11/521,924, filed on Sep. 15, 2006, now Pat. No. 7,528,017.

(60) Provisional application No. 60/749,121, filed on Dec. 7, 2005.

(51) Int. Cl.
H01L 29/76 (2006.01)

(52) U.S. Cl.
USPC ............ 257/288; 257/212; 307/5; 307/141.8; 323/220

(58) Field of Classification Search
USPC ............. 257/212, 288; 307/5, 141.8; 323/220
See application file for complete search history.

(56) References Cited

U.S. PATENT DOCUMENTS

| | | | |
|---|---|---|---|
| 3,369,159 A | 2/1968 | Sihvonen et al. | |
| 4,607,274 A | 8/1986 | Yoshitake | |

(Continued)

FOREIGN PATENT DOCUMENTS

| | | | |
|---|---|---|---|
| JP | 59-201459 A1 | 11/1984 | |
| JP | 7335894 A | 12/1995 | |

(Continued)

OTHER PUBLICATIONS

Kamuro Setsushi; "Complementary Metal Oxide Semiconductor Field Effect Transistor Integrated Circuit"; esp@cenet; Publication No. JP59201459 (A); Publication Date: Nov. 15, 1984; esp@cenet Database—Worldwide, http://v3.espacenet.com/publicationDetails/biblio?adjacent=true&KC=A&date=1 . . . .

(Continued)

Primary Examiner — Thanh V Pham
(74) Attorney, Agent, or Firm — Andrew D. Fortney

(57) ABSTRACT

Process variation-tolerant diodes and diode-connected thin film transistors (TFTs), printed or patterned structures (e.g., circuitry) containing such diodes and TFTs, methods of making the same, and applications of the same for identification tags and sensors are disclosed. A patterned structure comprising a complementary pair of diodes or diode-connected TFTs in series can stabilize the threshold voltage ($V_t$) of a diode manufactured using printing or laser writing techniques. The present invention advantageously utilizes the separation between the $V_t$ of an NMOS TFT ($V_{tn}$) and the $V_t$ of a PMOS TFT ($V_{tp}$) to establish and/or improve stability of a forward voltage drop across a printed or laser-written diode. Further applications of the present invention relate to reference voltage generators, voltage clamp circuits, methods of controlling voltages on related or differential signal transmission lines, and RFID and EAS tags and sensors.

32 Claims, 8 Drawing Sheets

U.S. PATENT DOCUMENTS

| | | | |
|---|---|---|---|
| 4,617,482 A * | 10/1986 | Matsuda | 327/391 |
| 5,469,106 A | 11/1995 | Dow | |
| 5,521,601 A | 5/1996 | Kandlur et al. | |
| 5,550,547 A | 8/1996 | Chan et al. | |
| 5,754,074 A | 5/1998 | Kelly | |
| 5,834,903 A * | 11/1998 | Christian | 315/219 |
| 6,953,951 B2 | 10/2005 | Yamazaki et al. | |
| 7,336,117 B2 * | 2/2008 | La Malfa et al. | 327/333 |
| 7,459,352 B2 | 12/2008 | Yamazaki et al. | |
| 2004/0173867 A1 | 9/2004 | Beigel | |
| 2005/0008880 A1 | 1/2005 | Kunze et al. | |
| 2005/0174845 A1 | 8/2005 | Koyama et al. | |
| 2009/0146149 A1 | 6/2009 | Yamazaki et al. | |

FOREIGN PATENT DOCUMENTS

| | | | |
|---|---|---|---|
| JP | 2000150894 A | 5/2000 | |
| JP | 2002189427 A | 7/2002 | |
| JP | 2005167212 A | 6/2005 | |

OTHER PUBLICATIONS

Korean Office Action with English Translation; Dated Sep. 25, 2009; Korean Patent Application No. 10-2006-0115817; 8 pgs. total; Korean Intellectual Property Office, Republic of Korea.

Notice of Reasons for Rejection dated Sep. 6, 2011; Japanese Patent Application No. 2006307027; Japan Patent Office, Japan.

Noriaki Sato and Kazuo Sukegawa; "Semiconductor Device"; Espacenet; Japanese Publication No. JP 7335894 (A); Publication Date: Dec. 22, 1995; Espacenet Database—Worldwide; http://worldwide.espacenet.com/.

Masataka Shingu and Hisayoshi Yamoto; "Semiconductor Device and Its Manufacture"; Espacenet; Japanese Publication No. JP 2000150894 (A); Publication Date: May 30, 2000; Espacenet Database—Worldwide; http://worldwide.espacenet.com/.

Japanese Final Notice of Reasons for Rejection with English translation dated Jan. 24, 2012; Japanese Patent Application No. P2006-307027; 7 pages total; Japan Patent Office, Japan.

Shunpei Yamazaki, Hajime Kimura, Shinji Maekawa and Osamu Nakamura; "Method of Manufacturing Semiconductor Device and Wiring Board"; Patent Abstracts of Japan; Japanese Publication No. JP 2005-167212 (A); Publication Date: Jun. 23, 2005; 2 pages; Japan Patent Office, Japan.

Shunpei Yamazaki and Hideaki Kuwabara; "Semiconductor Device and Its Manufacturing Method"; Patent Abstracts of Japan; Japanese Publication No. JP 2002-189427 (A); Publication Date: Jul. 5, 2002; Japan Patent Office, Japan.

* cited by examiner

PROCESS-VARIATION TOLERANT SERIES-CONNECTED NMOS AND PMOS DIODES, AND STANDARD CELLS, TAGS, AND SENSORS CONTAINING THE SAME

RELATED APPLICATIONS

This application is a divisional of U.S. patent application Ser. No. 12/424,509, filed Apr. 15, 2009, now U.S. Pat. No. 7,932,537, issued May 5, 2009, which is a continuation of Ser. No. 11/521,924, filed Sep. 15, 2006, now U.S. Pat. No. 7,528, 017, which claims priority to U.S. Provisional Patent Application No. 60/749,121, filed Dec. 7, 2005, each of which is incorporated herein by reference in its entirety.

FIELD OF THE INVENTION

The present invention generally relates to the field of radio frequency identification (RFID) and electronic article surveillance (EAS) tags and sensors, and processes for manufacturing the same. In particular, the present invention relates to a process variation-tolerant diodes and diode-connected thin film transistors (TFTs), printed or patterned structures (e.g., circuitry) containing such diodes and TFTs, methods of making the same, and applications of the same for such tags and sensors.

BACKGROUND OF THE INVENTION

In many simple thin film fabrication processes, convenient diode fabrication processes may be difficult and/or expensive to implement. As a consequence, in many thin film processes, diode-connected transistors are used to simulate diodes in circuits. Diode-connected transistors may suffer from a potential drawback in thin film transistor (TFT) processes, in that the threshold voltage of TFTs in many TFT processes may shift from run to run, or from lot to lot. As a result, diode-connected TFTs made by such processes may show some variation in forward voltage drop, and the variation at times can be unacceptably large. This is particularly unfavorable when the diodes or diode-connected TFTs are used in reference voltage supply circuits. As a consequence, there is a need for a diode connected TFT architecture that is more tolerant of process-induced threshold voltage variations.

SUMMARY OF THE INVENTION

Embodiments of the present invention relate to a method of making process variation-tolerant diodes and diode-connected thin film transistors (TFTs), printed or patterned structures (e.g., circuitry) containing such diodes and TFTs, and applications of the same for identification tags and sensors. Further applications of the present invention relate to reference voltage generators, voltage clamp circuits, methods of controlling voltages on related or differential signal transmission lines, and HF, UHF and RFID tags and sensors.

The method of making complementary diodes generally comprises (a) forming a first patterned semiconductor layer on a substrate, the first patterned semiconductor layer having a first conductivity type; (b) forming a second patterned semiconductor layer on the substrate, the second patterned semiconductor layer having a second conductivity type; (c) forming a patterned insulator layer over the first and second patterned semiconductor layers and the substrate; and (d) forming a patterned metal layer on the patterned insulator layer and in electrical contact with the first and second patterned semiconductor layers. Generally, at least one of the forming steps (a)-(d) above comprises printing or laser writing the semiconductor or metal layer.

The circuit generally comprises (1) an NMOS diode having at least one printed or laser-written structure therein; (2) a PMOS diode having at least one printed or laser-written structure therein; and (3) a metal wire connecting the NMOS diode to the PMOS diode. In further embodiments, a clamp circuit according to the present invention comprises at least one complementary diode pair circuit, in series between first and second nodes (e.g., differential signal transmission lines), and an AC clamp circuit generally comprises first and second clamp circuits, coupled between said first and second nodes in parallel, but with opposite polarity.

The identification devices generally comprise (i) an antenna and/or inductor; (ii) a rectifier, configured to convert a radio frequency signal received by said antenna and/or inductor into power; (iii) the present alternating current clamp circuit, configured to limit a voltage of the radio frequency signal; and (iv) logic configured to recover a clock signal from the radio frequency signal and generate an identification signal. In general, said antenna and/or inductor comprises a conductive coil, coupled to first and second rectifier input nodes, and the alternating current clamp circuit is coupled between said first and second rectifier input nodes.

A patterned structure comprising a complementary pair of diodes or diode-connected TFTs in series in accordance with the present invention can stabilize the threshold voltage ($V_t$) of a diode manufactured using printing or laser writing techniques. The present invention advantageously utilizes the relatively constant difference of the $V_t$ of an NMOS TFT ($V_{tn}$) and the $V_t$ of a PMOS TFT ($V_{tp}$) to establish and/or improve stability of a forward voltage drop across a printed or laser-written diode. These and other advantages of the present invention will become readily apparent from the detailed description of preferred embodiments below.

BRIEF DESCRIPTION OF THE DRAWINGS

FIG. 1C is a cross-sectional view of two exemplary diode-connected TFTs that can be used as part of the circuit shown in FIGS. 4-6 (TFT20 and TFT5 for example).

FIGS. 2C and 3C are cross-sectional views along orthogonal axes of exemplary complementary diodes that can be part of a process variation-tolerant clamp or shunt circuit.

DETAILED DESCRIPTION OF THE PREFERRED EMBODIMENTS

Figure 1A:
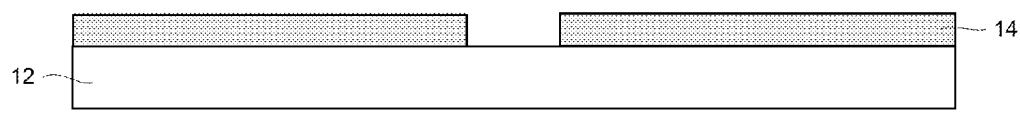
FIGS. 1A-1C are cross-sectional diagrams of structures showing stages of exemplary processes of making a diode-connected TFT and process variation-tolerant clamp or shunt circuit. In particular.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

In one aspect, the present invention relates to a method of making a printed or patterned circuit useful for identification tags and/or sensors, comprising the steps of (a) forming a first patterned semiconductor layer on a substrate, the first patterned semiconductor layer having a first conductivity type; (b) forming a second patterned semiconductor layer on the substrate, the second patterned semiconductor layer having a second conductivity type; (c) forming a patterned insulator layer over the first and second patterned semiconductor layers and the substrate; and (d) forming a patterned metal layer on the patterned insulator layer and in electrical contact with the first and second patterned semiconductor layers. In general, at least one of the forming steps (a)-(d) above comprises printing or laser writing the semiconductor or metal layer.

Embodiments of the present invention further relate to process variation-tolerant diodes and diode-connected thin film transistors (TFTs), printed or patterned structures (e.g., circuitry) containing such diodes and TFTs, methods of making the same, and applications of the same for identification (e.g., HF, UHF, RFID and EAS) tags and sensors. In one embodiment, the present invention relates to printed thin film structures comprising an n-channel metal oxide semiconductor (NMOS) diode (in particular a diode-connected NMOS TFT), a p-channel metal oxide semiconductor (PMOS) diode (in particular a diode-connected PMOS TFT), and a metal wire connecting the NMOS diode and the PMOS diode in series. Such series-connected diodes advantageously provide a threshold voltage ($V_t$) that is independent of the absolute $V_t$ of the NMOS diode-connected TFT and PMOS diode-connected TFT and utilizes the separation between $V_{tN}$ (the threshold voltage of an NMOS TFT) and $V_{tP}$ (the threshold voltage of a PMOS TFT) to establish a relatively controlled and/or stable forward voltage drop.

In particular, the threshold voltage $V_t$ of a series connected diode-connected TFT generally equals the differential sum of $V_{tN}$ and $V_{tP}$. An alternative embodiment of the present invention concerns a circuit comprising one or more (and preferably a plurality of) such series-connected diode-based TFTs. Such a circuit establishes a net voltage drop that is generally equivalent to the forward voltage drop for a single NMOS-PMOS diode pair times the number of such pairs connected in series.

A circuit as described herein above may be utilized in a voltage clamping circuit (a "clamp") to modulate the turn-on behavior of a TFT [a "shunt" TFT to provide the clamping action]. In an alternative embodiment, such a voltage clamping circuit may be advantageously used in an AC circuit wherein a parallel connection of two such clamping circuits containing an additional diode connected in series with the shunt TFT are connected in opposite directions across the AC terminals. The combination of such a diode-wired TFT in series with the shunt TFT may prevent premature turn-on of the shunt TFT in a portion of the AC cycle where the voltage difference on the complementary or differential lines is insufficient to pass current through the complementary diode pair(s).

The voltage clamp circuit of the present invention may be advantageously utilized in applications that include, but are not limited to, EAS and RFID tags and sensors. The invention, in its various aspects, will be explained in greater detail below with regard to exemplary embodiments.

An Exemplary Process for Manufacturing Complementary Diode-Connected Thin Film Transistors In one aspect, the preset invention relates to a method of making complementary diodes, comprising (a) forming a first patterned semiconductor layer on a substrate, the first patterned semiconductor layer having a first conductivity type; (b) forming a second patterned semiconductor layer on the substrate, the second patterned semiconductor layer having a second conductivity type; (c) forming a patterned insulator layer over the first and second patterned semiconductor layers and the substrate; and (d) forming a patterned metal layer on the patterned insulator layer and in electrical contact with the first and second patterned semiconductor layers. In a preferred embodiment, at least one of the forming steps (a)-(d) above comprises printing or laser writing the semiconductor or metal layer.

In one embodiment, forming the patterned semiconductor layers comprises printing or laser writing first and second semiconductor compositions, respectively. In an implementation directed towards formation of Schottky diodes, forming the second patterned semiconductor layer comprises printing or laser writing a second semiconductor composition on the first patterned semiconductor layer. Similarly, forming the patterned metal layer may comprise printing or laser writing a first metal composition.

In another embodiment (generally relating to complementary diode-configured TFTs), the method further comprises the step of forming a patterned gate structure over the patterned semiconductor layer(s). Typically, the gate structure is formed after said first and second patterned semiconductor layers. Furthermore, the patterned gate structure may comprise a second patterned metal layer, which is typically on a patterned gate dielectric layer. Consequently, forming the patterned gate structure may comprise printing or laser writing a second metal composition on a gate dielectric layer.

In an alternative embodiment (generally relating to complementary Schottky diodes), the method further comprises the step of forming a third patterned semiconductor layer over the first patterned semiconductor layer. Typically, the third patterned semiconductor layer is formed after said first patterned semiconductor layer.

An exemplary process for making complementary diode-connected TFTs shall be explained below with reference to FIGS. 1A-1C. FIG. 1C shows an exemplary circuit 10, including diode-connected NMOS TFT 15a, diode-connected PMOS TFT 15b, and wire 26 coupling the diode-connected TFTs 15a and 15b in series. Many embodiments of the present invention comprising a patterned conducting and/or semiconducting thin film structure may be obtained by conventional TFT processing technology and/or high-resolution printing and/or laser writing and/or definition technology using metal nanoparticle- and/or liquid silane-based inks (see, for example, U.S. Provisional Pat. Appl. No. 60/697,599; and U.S. patent application Ser. Nos. 11/246,014, 11/243,460, 11/203,563, 11/104,375, 11/084,448, 10/956,714, 10/950,373, 10/949,013, 10/885,283, 10/789,317, 10/749,876, and/or 10/722,255, respectively filed on Oct. 6, 2005, Oct. 3, 2005, Aug. 11, 2005, Apr. 11, 2005, Mar. 18, 2005, Oct. 1, 2004, Sep. 24, 2004, Sep. 24, 2004, Jul. 6, 2004, Feb. 27, 2004, Dec. 31, 2003 and Nov. 24, 2003).

FIG. 1A shows a first step in the exemplary process. A printed and/or patterned semiconductor layer 14 is formed on an insulating substrate 12. For example, a doped or undoped silicon composition may be deposited (e.g., by printing an ink containing a silane and/or silicon nanoparticles, either of which may further contain a germane, silagermane, and/or germanium and/or silicon-germanium nanoparticles) onto substrate 12 (see, e.g., U.S. patent application Ser. Nos. 10/616,147, 10/749,876, 10/789,317, 10/789,317, 10/950,373, 10/949,013 and/or 10/956,714. Printing may comprise inkjet printing, microspotting, stenciling, stamping, syringe dispensing, pump dispensing, screen printing, gravure printing, offset printing, flexography, or laser forward transfer of the composition (or a silicon-containing component thereof) onto the substrate. The separate structures or "islands" in semiconductor layer 14 can be printed separately or simultaneously, using the same semiconductor ink or different semiconductor inks (e.g., containing different dopants). Different semiconductor inks may be printed simultaneously using two sets of inkjet heads (each set containing one or more heads).

The printed silane- and/or silicon-containing layer is typically dried under conditions (e.g., at a temperature, in an atmosphere, under a pressure, and/or for a length of time) sufficient to remove substantially all of the solvent in the composition, and optionally irradiated (optionally during the printing process) under conditions (e.g., at a temperature, in an atmosphere, under a pressure, and/or for a length of time) sufficient to (i) cross-link, oligomerize and/or polymerize the silane, (ii) form a substantially uniform layer on the substrate, the layer comprising an oligo- and/or polysilane, and/or (iii) increase an average molecular weight, increase a viscosity and/or reduce a volatility of the composition. Thereafter, the printed silicon-containing film is cured (e.g., at a temperature of 350-500° C.) to produce a hydrogenated, amorphous silicon film (e.g., having a thickness of ~100 nm in a typical case). Then, the amorphous silicon film is (re)crystallized by annealing at a temperature sufficient to (re)crystallize the amorphous silicon, laser annealing, or transition metal-induced crystallization. Multiple thin films may be formed from the composition, either from the same composition to form a relatively thick layer, or from a plurality of different compositions (particularly when one or more of the compositions comprises a doped silane composition, in which case the different compositions can be used to form diodes having layers with different dopant[s] and/or dopant doses). Alternatively, a layer of silicon (e.g., amorphous silicon) may be conventionally blanket-deposited (e.g., by chemical vapor deposition), patterned (e.g., by photolithography) and crystallized (e.g., by annealing).

Substrate 12 may comprise, for example, a substrate having a low cost and ease of processing, relative to single crystal silicon substrates (and in one embodiment, relative to flat panel display substrates). For example, substrate 12 may comprise, e.g., a plastic sheet (e.g., comprising a polyimide, polycarbonate, or other high temperature polymer), a thin glass sheet, a glass/polymer laminate, etc. In one embodiment, the substrate has properties (e.g., a thickness, tensile strength, modulus of elasticity, glass transition temperature, etc.) acceptable for roll-to-roll manufacturing (e.g., spool-based and/or roll-to-roll printing processes).

Alternatively, substrate 12 may comprise an insulator (e.g., a spin on glass [SOG] or grown or anodized oxide layer) on a conducting or semiconducting substrate. Also, the insulator may be deposited onto or formed on a conventional metal foil (e.g., see U.S. patent application Ser. No. 10/885,283, filed Jul. 6, 2004, entitled "MOS Electronic Article Surveillance, RF and/or RF Identification Tag/Device, and Methods for Making and Using the Same," the relevant portions of which are incorporated herein by reference). Depositing may comprise conventional spin-coating, printing (e.g., inkjet ["IJ"] printing), blade coating, dip coating, meniscus coating, slot coating, gravure printing, screen printing or spray coating a SOG ink composition comprising conventional one or more SOG components, one or more conventional solvents for conventional SOG compositions, and one or more conventional surfactants, tension reducing agents, binders and/or thickening agents. Typically, the step depositing the SOG layer is followed by conventional curing and cleaning steps.

Figure 1B:
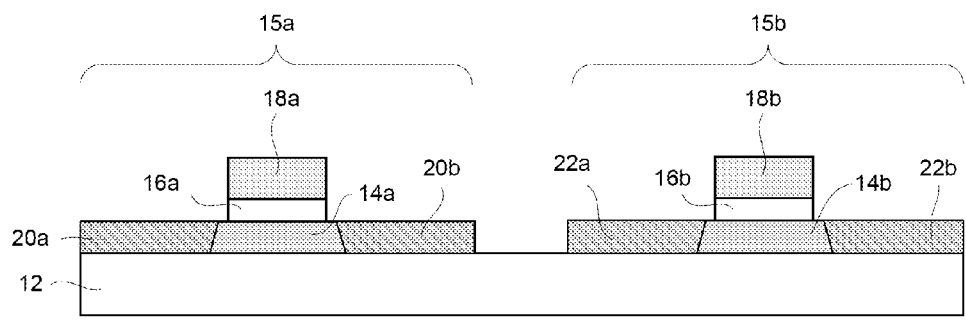
Figure 1C:
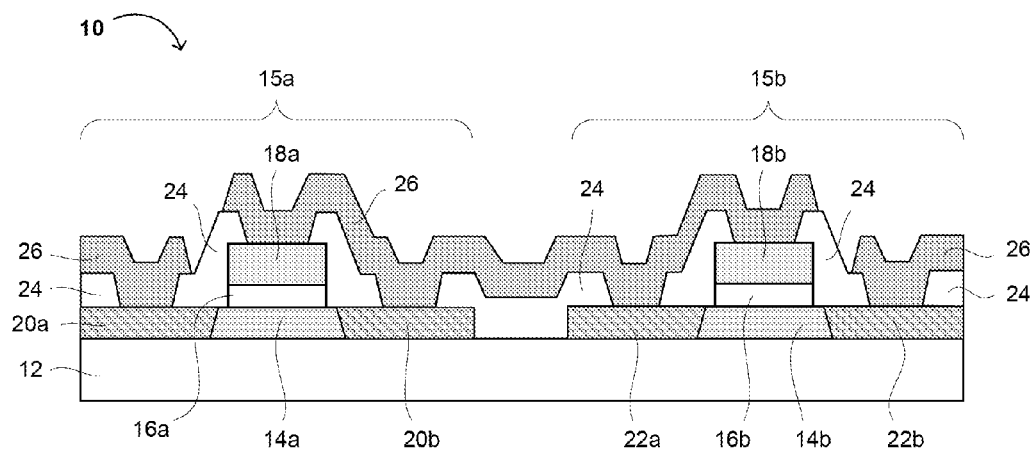

Referring now to FIG. 1B, a thin oxide surface layer 16 is grown on semiconductor layer 14 (generally by heating, exposure to a plasma, or irradiating the structure in an oxidizing atmosphere, such as oxygen). This oxidizing step forms a gate dielectric film. Alternatively, the gate dielectric and capacitor dielectric may be formed by conventional deposition and patterning of a corresponding dielectric material. A gate metal layer 18 may be formed on gate dielectric 16 by conventional photolithography or laser patterning (e.g., by [i] coating a deposited metal layer with a thermal resist or other conventional resist containing an IR dye and [ii] selectively irradiating the resist with a laser; see, e.g., U.S. patent application Ser. Nos. 11/084,448, filed on Mar. 18, 2005, and 11/663,296, the relevant portions of which are incorporated herein by reference). Removal of excess gate metal material by etching (preferably conventional wet etching) forms gates 18a and 18b, and a selective etch of the exposed gate dielectric 16 (also by wet etching with dilute aqueous HF or buffered oxide etch [BOE] solution, which typically comprises an aqueous $HF:NH_4F$ solution) forms gate oxides 16a and 16b. Alternatively, the gate metal layer may be defined by printing or other lithographic means including embossing, imprinting, inkjet printing or other high resolution patterning technology.

Next, semiconductor regions 20a-b are heavily doped with a first type of dopant (e.g., n-type or p-type), generally by conventional ion implantation or dopant diffusion (e.g., printing a spin-on dielectric [SOD] and annealing to drive the dopant into the semiconductor layer) into the regions of semiconductor layer 14 not covered by gate 16a. In the case of dopant diffusion, a SOD containing the dopant can be printed onto the structure of FIG. 1B, much like as described above for the separate islands in semiconductor layer 14. Printing may comprise inkjet printing, microspotting, stenciling, stamping, syringe dispensing, pump dispensing, screen printing, gravure printing, offset printing, or flexography. The doped SOD(s) can be printed separately or simultaneously, generally using different inks (e.g., containing different dopants of different conductivity types [e.g., n-type or p-type], and if desired, in different dopant concentrations). Different SOD inks may be printed simultaneously using two sets of inkjet heads (each set containing one or more heads).

Alternatively, a source/drain contact layer may be formed on the upper surface of semiconductor regions 20a-b by depositing a doped semiconductor composition onto the gate 16a and exposed areas of semiconductor layer 14, then curing and laser irradiating the doped semiconductor composition to selectively crystallize irradiated portions of the composition (and preferably activate dopant therein), and selectively removing non-irradiated portions of the composition by wet etching (see, e.g., U.S. patent application Ser. No. 11/084,448, filed on Mar. 18, 2005). Such doped semiconductor compositions may be selectively deposited by printing or inkjetting a doped silicon-containing formulation, such as an $N^+$-doped silane ink (see U.S. patent application Ser. Nos.

10/950,373, 10/949,013, and 10/956,714, filed on Sep. 24, 2004, Sep. 24, 2004, and Oct. 1, 2004, respectively, the relevant portions of each of which are incorporated herein by reference) onto the gate 16a and exposed portions of semiconductor layer 14. To the extent heavily doped regions 20a-b comprise an amorphous Group IVA element-containing material (e.g., Si and/or Ge), one preferably crystallizes them before depositing the next layer. In one example, the doped semiconductor regions 20a-b are first cured by furnace annealing and then crystallized by laser crystallization (and preferably, some or substantially all of the dopant therein activated during the crystallization). Alternatively, dopant atoms may be introduced into or onto the exposed surfaces of semiconductor regions 12 by plasma deposition, laser decomposition, vapor deposition or other technique, after which the doped regions 18a-b are converted into source and drain contacts by annealing.

Then, heavily doped semiconductor regions 22a-b are formed by a similar technique as heavily doped semiconductor regions 20a-b, but generally with a different type (e.g., n-type vs. p-type) of dopant. In other words, one of semiconductor regions 18a-b and semiconductor regions 20a-b contains an n-type dopant and the other contains a p-type dopant. If necessary and/or desired, heavily doped regions 20a-b and 22a-b may be further patterned into active islands, but in general, printing and/or patterning semiconductor regions 12 should suffice to define the active areas of the devices. As described above, $N^+$ and $P^+$ regions may be deposited separately, but cured, laser irradiated and wet etched in the same processing steps. Thereafter, any non-crystallized portions of doped regions 20a-b and 22a-b may be removed by selective wet etching.

After optional conventional cleaning, a dielectric layer 24 (which may comprise a conventional spin-on glass [SOG] composition) may be printed or coated onto the structure of FIG. 1B. If printed, one or more (and preferably all) of gates 18a-b and/or heavily doped regions 20a-b and 22a-b may remain exposed. If coated, portions of the SOG/dielectric layer 24 above gates 18a-b and/or heavily doped regions 20a-b and 22a-b may be removed photolithographically (e.g., by coating with a photoresist, irradiating the photoresist through a contact mask, etching [preferably wet etching], then stripping the photoresist and cleaning the surface of the device) or by a laser-resist process as described in U.S. Provisional Patent Application No. 60/663,296 and/or U.S. patent application Ser. No. 11/203,563, filed on Oct. 7, 2005, the relevant portions of which are incorporated herein by reference). If dielectric layer 24 comprises a SOG composition, it is generally cured and/or converted to a dielectric material (such as silicon dioxide) by conventional techniques. Alternatively, dielectric layer 24 may comprise a conventional polyimide (which may further include a dye that absorbs infrared, visible or ultraviolet light, e.g., configured or adapted for laser patterning).

In an alternative approach, under appropriate conditions and using known etchant compositions, the thin oxide film 16 may be retained after forming gates 18a-b, and etching the dielectric layer 24 may also remove the exposed portions of thin oxide film 16. Optionally, a small amount (e.g., up to about 30 nm) of doped polysilicon regions 20a-b/22a-b may also be removed (e.g., to improve margins in subsequent contact formation).

Optionally, a metal (such as cobalt [Co] or nickel [Ni]) may be plated (or selectively grown or deposited) on heavily doped regions 20a-b and 22a-b (generally after formation of dielectric layer 24, e.g., by high-resolution patterning, such conventional photolithography or laser lithography/patterning; see U.S. patent application Ser. Nos. 10/722,255 and/or 11/203,563, filed on Nov. 24, 2003 and Oct. 7, 2005, respectively, the relevant portions of which are incorporated herein by reference). Subsequent heat treatment (at a temperature sufficient to crystallize and/or form silicide from the gate material, if silicon is used) may also form gates 16a-b, which in some cases, can be used without further modification.

Contacts and a first level of metallization may be formed by metallization processing techniques conventionally used in the integrated circuit/semiconductor manufacturing industries. For example, forming contacts and metallization 26 may comprise sputtering a relatively thin barrier and/or adhesive layer such as Ti, TiN or a TiN-on-Ti bilayer, then a relatively thick bulk conductor layer, such as Al or Al—Cu alloy (containing, e.g., 0.5-4 wt. % Cu), followed by conventional photolithographic definition of contacts and metal lines that are subsequently etched (preferably wet etched using a conventional $NH_4OH/H_2O_2$ etch composition that selectively etches metals such as Al, TiN and Ti relative to a metal silicide). Alternatively, a layer of silicon or barrier metal may be printed or otherwise deposited or formed on exposed surfaces of gates 18a-b, and/or a conductive metal may be selectively plated, deposited or printed thereon (optionally with subsequent thermal treatment or annealing to form a metal silicide). Of course, contacts and/or metallization to gates 18a-b may be formed in an area outside of the source and drain regions (when viewed from a layout or top-down perspective). Alternatively, the contacts and/or metallization may be patterned by a laser process (via resist patterning or alternatively direct laser patterning of metal precursor compositions) as described in U.S. Provisional Patent Application No. 60/663,296 and/or U.S. patent application Ser. No. 11/203,563, respectively filed on Mar. 18, 2005, and Oct. 7, 2005, the relevant portions of which are incorporated herein by reference) or a laser-based process as described in U.S. patent application Ser. No. 10/722,255, filed on Nov. 24, 2003, the relevant portions of which are incorporated herein by reference). Any photoresist present may then be conventionally stripped, and the device may be conventionally cleaned, to form the clamp circuit shown in FIG. 1C.

To complete the device, a further insulator or dielectric layer (e.g., comprising a SOG composition) may be printed (e.g., by inkjetting) or blanket deposited (e.g., by conventional spin coating, blade coating, screen printing, dip coating, meniscus coating, slot coating, gravure printing, or spray coating) over the device (not shown). If an additional layer of metallization is desired, contact holes over predetermined locations in the metallization layer 26 may be conventionally formed in the insulator layer (or may remain following printing), and a second layer of metallization may be formed in the same manner as metallization layer 26. An uppermost, cap or passivation layer (e.g., comprising a further SOG layer or a silicon nitride layer) may then be formed over the entire device as described herein, cured, and (optionally) an encapsulant, support or adhesive may be laminated thereto.

An Exemplary Process for Manufacturing Complementary Schottky Diodes

An exemplary process for making complementary Schottky diodes shall be explained below with reference to FIGS. 2A-3C. FIGS. 2C and 3C show exemplary circuit 10', including NMOS diode 50a, PMOS diode 50b, and wire 90 coupling the diodes 50a and 50b in series.

Figure 2A:
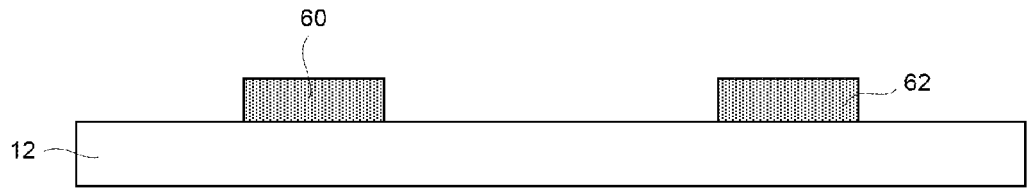
FIGS. 2A-2C and 3A-3C are cross-sectional diagrams of structures showing stages of exemplary processes of making complementary Schottky diodes. In particular.

FIG. 2A shows substrate 12 with doped semiconductor islands 60 and 62 thereon. FIG. 3A shows substrate 12 with doped semiconductor island 60 thereon, along a plane perpendicular to the plane of the page and aligned with axis z-z'. In general, substrate 12 is the same in FIGS. 2A-3C as in FIGS. 1A-1C. To form a preferred Schottky diode, the method comprises forming or depositing a heavily doped semiconductor layer (e.g., 60 or 62) first, before formation of other functional layers in the Schottky diode. Thus, as for doped semiconductor regions 20*a-b* and 22*a-b* in FIGS. 1B-1C, doped semiconductor islands 60 and 62 may be formed by depositing a doped semiconductor composition onto the substrate 12, then curing and laser irradiating the doped semiconductor composition to selectively crystallize irradiated portions of the composition (and preferably activate dopant therein), and selectively removing non-irradiated portions of the composition by wet etching. Such doped semiconductor compositions may be selectively deposited by printing or inkjetting a doped silicon-containing formulation, such as an $N^+$- or $P^+$-doped silane ink onto predetermined regions of the substrate 12. In such a method, a first silane ink containing a first type of dopant (e.g., n-type or p-type) is printed or inkjetted, then a second silane ink containing a second type of dopant (e.g., the other or the remaining type) to define one of doped semiconductor islands 60 and 62, then the compositions are dried, cured, and laser crystallized as described herein. Alternatively, after the first type of island is printed or inkjetted, it may be dried and/or cured before the second type of island is printed or inkjetted. In addition, doped semiconductor islands 60 and 62 may comprise more than one layer of such printed, cured and crystallized/activated material.

Alternatively, doped semiconductor islands 60 and 62 may be formed by blanket deposition and patterning, and the first and second (different) dopant types may be conventionally implanted or diffused into islands 60 and 62, respectively. However, due to the inevitable use of masks in such processing, such processing is less preferred than printing (e.g., inkjetting).

Figure 2B:
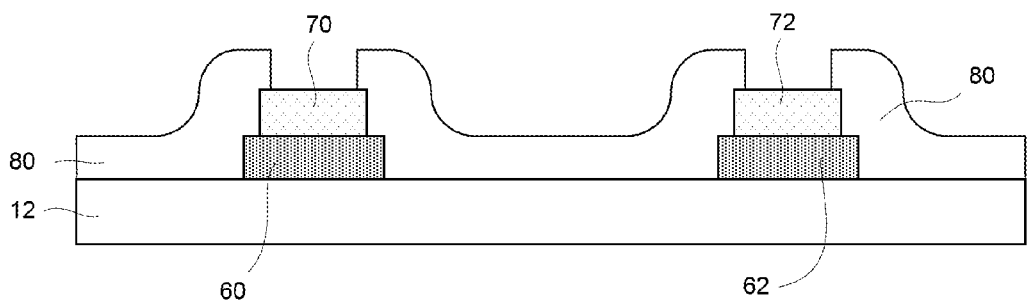
Figure 2C:
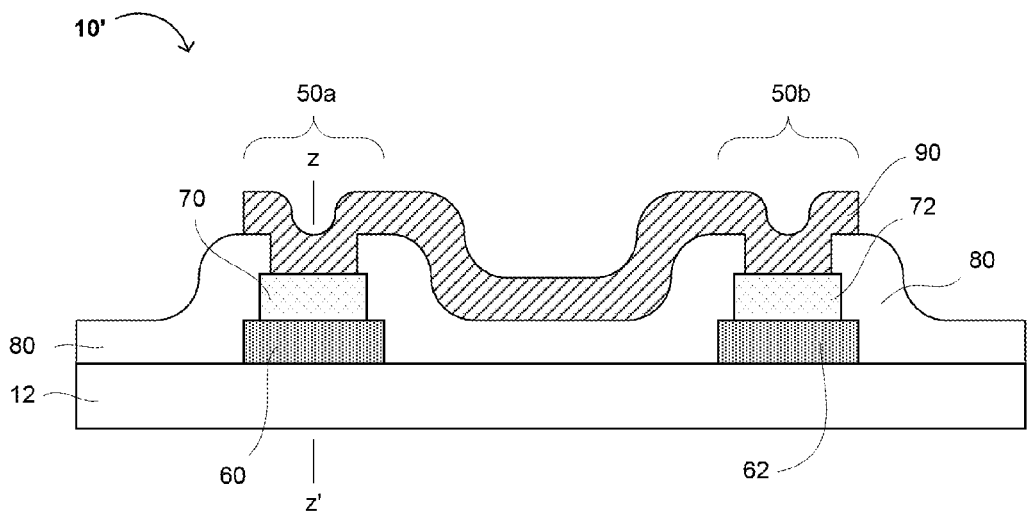
Figure 3A:
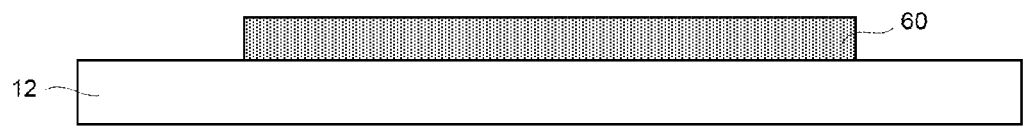
Figure 3B:
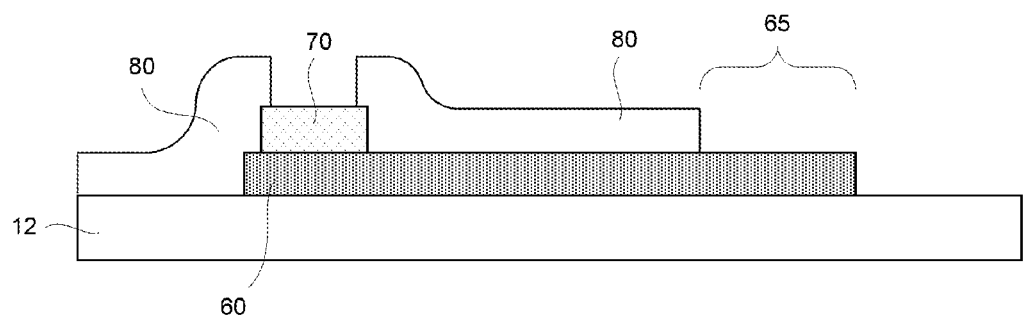
Figure 3C:
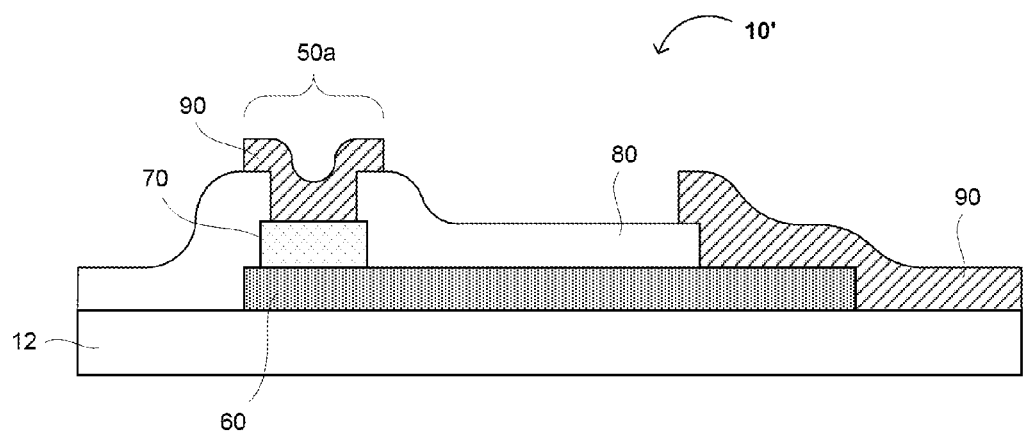

Referring to FIG. 2B, semiconductor layers 70 and 72 are respectively formed on doped semiconductor islands 60 and 62 by substantially the same process as doped semiconductor islands 60 and 62, but with material having different mobility (or charge-carrying) characteristics. For example, if doped semiconductor islands 60 and 62 are heavily doped with first and second dopant types, respectively, then semiconductor layers 70 and 72 may contain semiconducting material that is lightly doped with first and second dopant types, respectively; heavily doped with second and first dopant types, respectively; or intrinsic. For clarity, FIG. 3B shows a cross-section of semiconductor layer 70 on doped semiconductor island 60 along a plane orthogonal to the plane of the page. Naturally, a third semiconductor layer (not shown) may be formed on one or both of semiconductor layers 70 and 72, generally by the same process as semiconductor layer(s) 70 and/or 72, and the third semiconductor layer generally has different mobility (or charge-carrying) characteristics than the semiconductor layer on which it is formed (although such mobility characteristics may be substantially the same as the underlying doped semiconductor island 60 or 62). For example, if semiconductor layers 70 and 72 contain intrinsic semiconducting material, then the third semiconductor layers may be heavily doped with first and second dopant types, respectively.

Thereafter, an insulator layer 80 is formed on semiconductor layers 60/70 and 62/72 and on substrate 12 similarly to insulator layer 24 in FIG. 1, such that openings in insulator layer 80 are over the upper surfaces of the uppermost semiconductor layer in the diodes (e.g., semiconductor layers 70 and 72). As shown in FIG. 3B, insulator layer 80 is further formed such that a contact region 65 of semiconductor island 60 (and, by extension, semiconductor island 62) is exposed for subsequent electrical connection to other circuit elements. When substrate 12 has an electrically insulating upper surface, an end of semiconductor island 60 may be exposed in the contact region 65 to maximize physical contact with and/or minimize resistance and/or steps (e.g., topology or height differences) of any overlying metallization. When substrate 12 has an electrically conducting upper surface, insulator layer 80 is formed such that the contact region 65 of semiconductor island 60 has only an exposed upper surface for contact with overlying metallization similar to the exposed upper surface of semiconductor layer 70.

FIG. 2C shows the exemplary circuit 10' comprising series-wired diodes 15*a*-15*b*. Metallization 90 is formed on the insulator layer 80, in contact with the uppermost semiconductor layer in the diodes 15*a* and 15*b* (e.g., semiconductor layers 70 and 72, respectively). As shown in FIG. 3C, metallization 90 is also formed in contact with doped semiconductor island 60, although such metallization 90 is generally insulated from the metallization in contact with doped semiconductor island 62 (see FIG. 2C).

With regard to FIGS. 3A-3C, doped semiconductor island 62 and structures fabricated thereon may be substantially identical to doped semiconductor island 60 and structures fabricated thereon, and the orientation and length and width dimensions of the island and/or structures thereon may be the same as or different from those of the corresponding structure shown in FIGS. 3A-3C.

An Exemplary Circuit

In another aspect, the present invention further relates to circuits and layouts containing the above-described complementary diodes. Exemplary circuits include a diode chain comprising a NMOS diode and a PMOS diode in series, a reference voltage generator, and a clamp circuit. In each such circuit, the diodes may comprise Schottky diodes or diode-connected TFTs, as described above. Thus, the present invention further concerns a circuit, comprising (1) an NMOS diode having at least one printed or laser-written structure therein; (2) a PMOS diode having at least one printed or laser-written structure therein; and (3) a metal wire connecting the NMOS diode to the PMOS diode.

In one embodiment of the circuit, said NMOS diode comprises an NMOS thin film transistor (TFT) and said PMOS diode comprises a PMOS TFT. In an implementation involving printing a silicon-based ink, said NMOS diode comprises an n-doped semiconductor layer that, while in an amorphous phase, has a substantially uniform dopant distribution along substantially the entire thickness thereof, and said PMOS diode comprises a p-doped semiconductor layer that, while in an amorphous phase, has a substantially uniform dopant distribution along substantially the entire thickness thereof. In an alternative embodiment, said NMOS diode comprises a first Schottky diode having a printed or laser-written n-doped semiconductor layer, and said PMOS diode comprises a second Schottky diode having a printed or laser-written p-doped semiconductor layer. The metal wire may comprise a printed or laser-patterned metal wire.

Figure 4A:
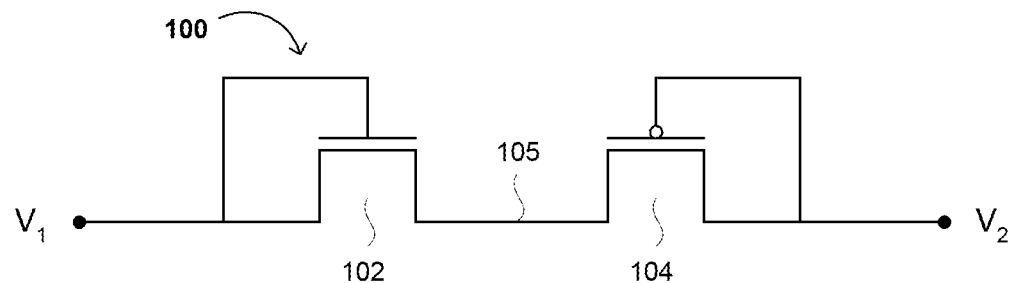
FIGS. 4A-4B are circuit diagrams of exemplary complementary diode pair and reference voltage circuits representative of the present invention.

FIG. 4A shows a diode chain 100, a circuit building block useful for providing a stable voltage drop across two nodes. Diode chain 100 generally comprises a complementary CMOS thin film transistor pair, including NMOS TFT 102 and PMOS TFT 104, each of which includes a gate and first and second source/drain terminals. Diode-connected NMOS TFT 102 may be obtained or formed by connecting the gate of TFT 102 to the drain of TFT 102. Further, PMOS TFT 104 may be obtained or formed by connecting the gate of TFT 104 to the source of TFT 104. The clamp circuit is formed when the drain of TFT 104 is connected to source of TFT 102 (e.g., the terminals are electrically coupled to the same node). This arrangement of diode-connected TFTs establishes a forward threshold voltage ($V_t$) from node $V_1$ to node $V_2$ that is substantially independent of the absolute threshold voltages ($V_t$'s) of the NMOS TFT 102 ($V_{tN}$) and/or the PMOS TFT 104 ($V_{tP}$). In particular, the threshold voltage $V_t$ of the complementary CMOS diode-connected TFT pair 100 equals the sum of the absolute values of $V_{tN}$ and $V_{tP}$, a value that is relatively constant across manufacturing and/or processing variations (i.e., appreciably smaller than the variation in either $V_{tN}$ or $V_{tP}$ across the same manufacturing and/or processing variations). In an alternative embodiment of the present circuit, diode chain 100 comprises complementary CMOS Schottky diodes, similarly arranged in series.

In operation, voltages $V_1$ and $V_2$ are the values of analog signals on related signal nodes. For example, $V_1$ and $V_2$ may represent signals coupled to opposed capacitor or inductor coil electrodes, or complementary signal lines of a differential signal path. Thus, the values of voltages $V_1$ and $V_2$ may be constantly changing, substantially constant at any value between the power supply voltages, or some combination thereof. When voltage $V_1 > V_{tN}$, NMOS TFT 102 turns on, and current is conducted through NMOS TFT 102 to the node 105 between NMOS TFT 102 and PMOS TFT 104. Similarly, when voltage $V_2 <$ a positive power supply $- V_{tP}$, PMOS TFT 104 turns on, and current is conducted through PMOS TFT 104 to the node 105 between PMOS TFT 104 and NMOS TFT 102. Typically, the positive power supply is from 5V to 20V.

A further embodiment of the present circuit comprises a plurality of such series connected complementary diodes. For example, one may wish to limit the voltage difference between two nodes (e.g., in an electrostatic discharge [ESD] protection circuit, between differential signal transmission lines, between opposed electrodes in a capacitor, etc.). A plurality of complementary diode pairs in series can provide a customized, relatively stable voltage difference limiting circuit (sometimes known as a swing limiting circuit or a clamp). In such a circuit, the voltage differential $V_\delta$ provided by a plurality of series-connected complementary diodes generally equals $n*(V_{tN}+V_{tP})$, where n is the positive integer number of complementary diode pairs 100 in series. Such a circuit establishes a net voltage drop that is generally equivalent to the forward voltage drop for a single NMOS-PMOS diode pair times the number of such pairs connected in series.

Referring back to FIG. 1C, the coupling between adjacent complementary diode pairs 100 is shown. Metal wire 26 connecting PMOS source/drain terminal 20b to NMOS source/drain terminal 22a corresponds to the node 105 between PMOS TFT 104 and NMOS TFT 102.

Figure 4B:
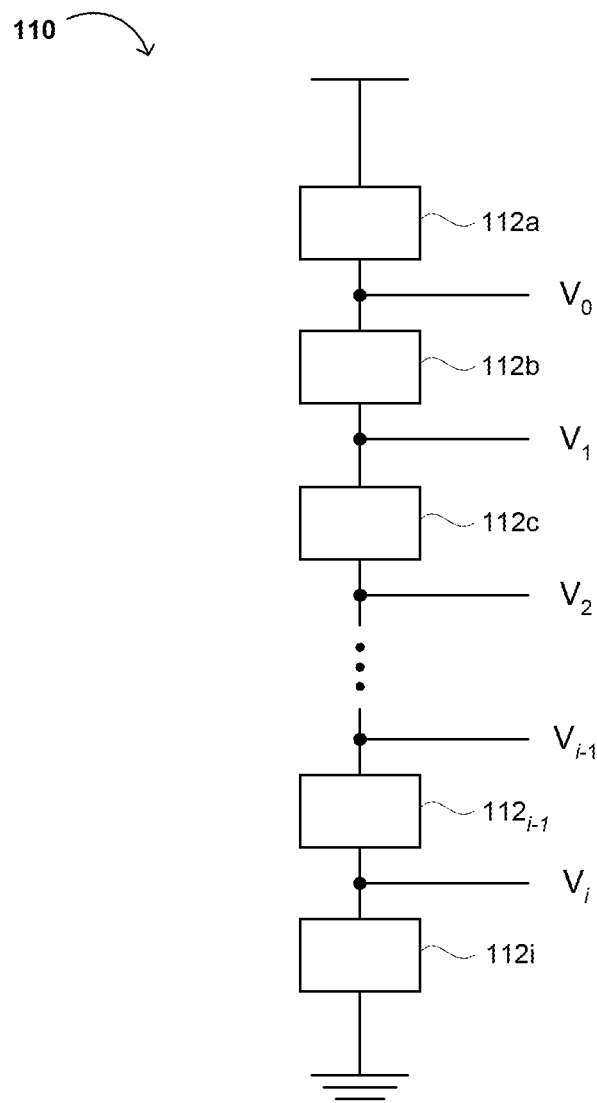

FIG. 4B shows an exemplary reference voltage generator 110, comprising a series of complementary diode pairs 112a-112i, each of which may correspond to the diode pair 100 in FIG. 4A or a Schottky diode pair 10' as shown in FIGS. 2C and 3C. One may optimize the number of diode pairs 112a-112i in the series or stack 110 for a given positive power supply and process (which produces a given, and in many cases, customizable voltage drop across a given diode pair). Such customization can be provided by adjusting the threshold voltage of one or both diodes, in accordance with known techniques and principles. One or more voltages $V_0$-$V_i$ at the nodes between the diode pairs may be output as a relatively stable voltage. For example, if the positive power supply is 12V and the voltage drop across each diode pair is 2V, then the voltage at $V_0$ is about 10V, the voltage at $V_1$ is about 8V, the voltage at $V_2$ is about 6V, etc., and the voltage at $V_i$ is about 2V. Thus, one may consider the complementary diode pairs 112a-112i as if they are individual diodes with threshold voltages that are relatively stable across process variations.

Where the voltage drop is not an integer divisor of the positive power supply voltage, or where a reference voltage that is not equal to either (i) the positive power supply voltage minus the voltage drop provided by one or more complementary diode pairs or (ii) the absolute value of the voltage drop provided by one or more complementary diode pairs, one may include a resistor in the diode stack 110. Such a resistor may be configurable (either by programming with a plurality of configuration memory bits or by conventional trimming with a laser), and may be located at any node along the stack (e.g., between the positive power supply and diode pair 112a, between ground and diode pair 112i, or between any two diode pairs).

A further aspect of the invention relates to a clamp circuit, comprising at least one of the present complementary diode pair circuits (preferably, a plurality of such complementary diode pair circuits), in series between first and second nodes, such as related or differential signal transmission lines. In further embodiments, the clamp circuit may further comprise (i) a shunt transistor having a gate receiving an output from one of said NMOS and PMOS diodes, a source coupled to one of said first and second nodes and a drain coupled to the other of said first and second nodes, and/or (ii) a resistor coupled between one of said first and second nodes and the gate of the shunt transistor. An alternating current clamp circuit according to the present invention generally comprises first and second clamp circuits, coupled between said first and second nodes in parallel, but with an opposite polarity.

Figure 5A:
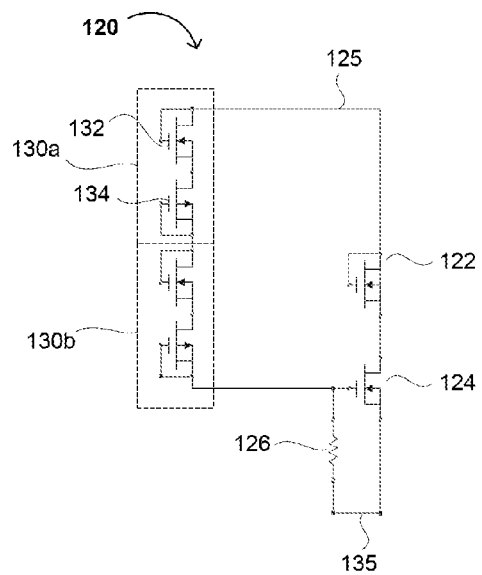
FIGS. 5A-5C are circuit diagrams of exemplary clamp circuits representative of the present invention.

FIG. 5A shows an exemplary DC voltage clamp circuit 120, comprising first and second complementary diode pairs 130a and 130b, diode 122, shunt transistor 124, and resistor 126. The voltage clamp circuit of FIG. 5A advantageously utilizes the stabilized net forward voltage drop provided by complementary diode pairs 130a and 130b to turn shunt TFT 124 on and off, and thereby provide the clamping function. Thus, the output of the series of complementary diode pairs 130a and 130b modulates the turn-on behavior of shunt TFT 124 which provides the clamping action.

For example, node 135 may be configured to have a voltage that is clamped to the voltage on node 125 (effectively preventing the voltage on node 135 from having a value greater than that on node 125 plus a predetermined value). When the voltage difference between nodes 125 and 135 is sufficiently high (e.g., greater than the forward voltage drop provided by first and second complementary diode pairs 130a and 130b and the voltage differential across resistor 126), the voltage on the gate of shunt transistor 124 is sufficient to pass some current from node 135 to node 125, thereby clamping the voltage on node 135 (assuming, of course, that the voltage on node 125 is sufficient to turn on diode-connected TFT 122). Once the voltage differential returns to a value less than the two voltage drops across complementary diode pairs 130a and 130b (e.g., by passing current through shunt transistor 124 and diode 122), then shunt transistor 124 turns off.

As is apparent to one skilled in the art, resistor 126 is configured to provide a drain-to-gate voltage differential across shunt transistor 124, and the resistance is chosen based on the diode forward currents. Also, diode 122, which is configured to prevent inadvertent turn-on of shunt TFT 124 when the voltage at node 125 is greater than two diode drops below the voltage at node 135, is not absolutely necessary for the operation of DC clamp circuit 120; it may be absent or replaced with, e.g., a (configurable) resistor. Naturally, and number of complementary diode pairs may be connected in series in the stack, depending on the threshold voltages of the NMOS and PMOS diodes or diode-configured TFTs, and the desired voltage differential to be provided by the clamp circuit 120.

Figure 5B:
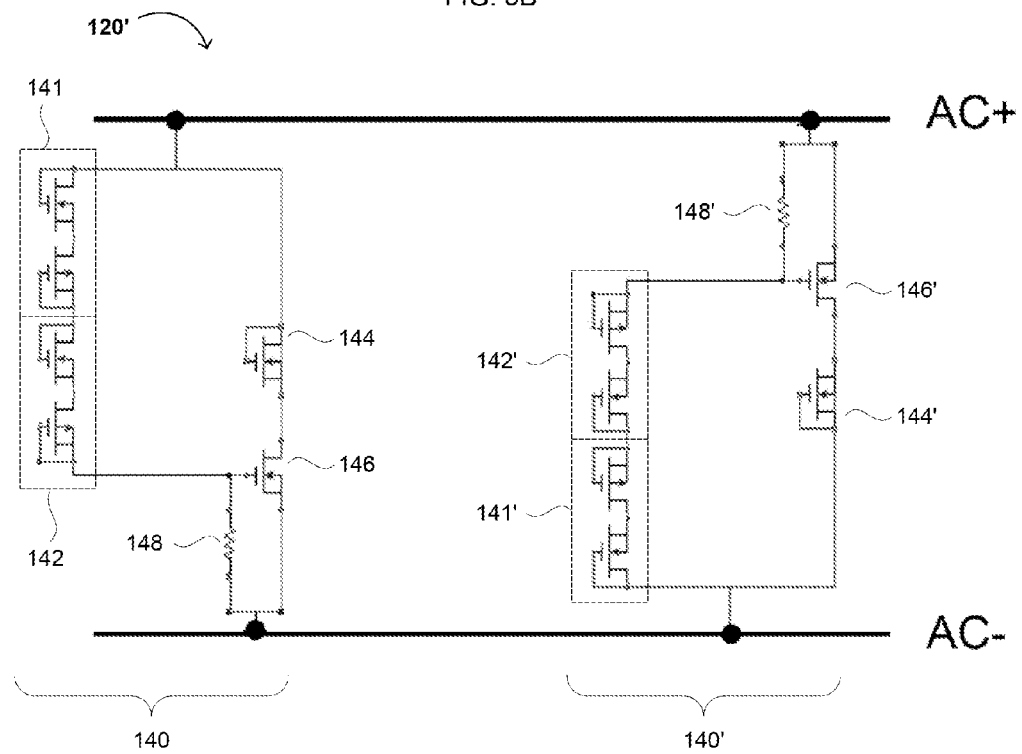

FIG. 5B shows an exemplary AC clamp circuit 120', comprising two clamp circuits 140 and 140', connected in parallel, in opposite directions, across differential AC terminals AC+ and AC−. Each of DC clamp circuits 140 and 140' are essentially the same as DC clamp circuit 120 of FIG. 5A. The addition of the diode-wired TFTs 144 and 144' in series with the shunt TFTs 146 and 146', respectively, prevents premature turn-on of the shunt TFTs in the opposite voltage portion of the AC cycle on differential AC terminals AC+ and AC−.

For example, differential terminals AC+ and AC− may be configured to have a maximum voltage differential between them. This is particularly the case when differential terminals AC+ and AC− receive or carry a differential periodic signal, such as that transmitted by conventional high frequency (HF), ultrahigh frequency (UHF), radio frequency (RF) and electronic article surveillance (EAS) systems. Thus, clamp circuit 120' may be configured to prevent the voltage on either differential terminal from having a value greater than that on the other terminal plus a predetermined value. The predetermined value is generally determined by the complementary diode pair stacks 141-142 and 141'-142'.

For example, when the voltage difference between terminals AC+ and AC− is sufficiently high (e.g., greater than the forward voltage drop provided by one of first and second complementary diode pairs 141-142 or 141'-142', depending on which terminal has the relatively high voltage and which has the relatively low voltage), the voltage on the gate of one of the shunt transistors 144 or 144' is sufficient to pass current from one of the terminals AC+ and AC− to the other, thereby clamping the voltage swing between terminals AC+ and AC− and maximizing the voltage differential between the terminals. Once the voltage differential returns to a value less than the voltage drops across the complementary diode pairs (e.g., by passing current through shunt transistor 144 and diode 146 or the complementary shunt transistor 144' and diode 146'), then the shunt transistor 144 (or 144') turns off. In this manner, diodes 146 and 146' not only prevent premature turn-on of the shunt TFTs 144 and 144' during the non-clamped portions of the AC cycles of a periodic signal received on or carried by the differential pair AC+ and AC−, but they may also function to limit the excursion on the node to which its gate is connected.

Figure 5C:
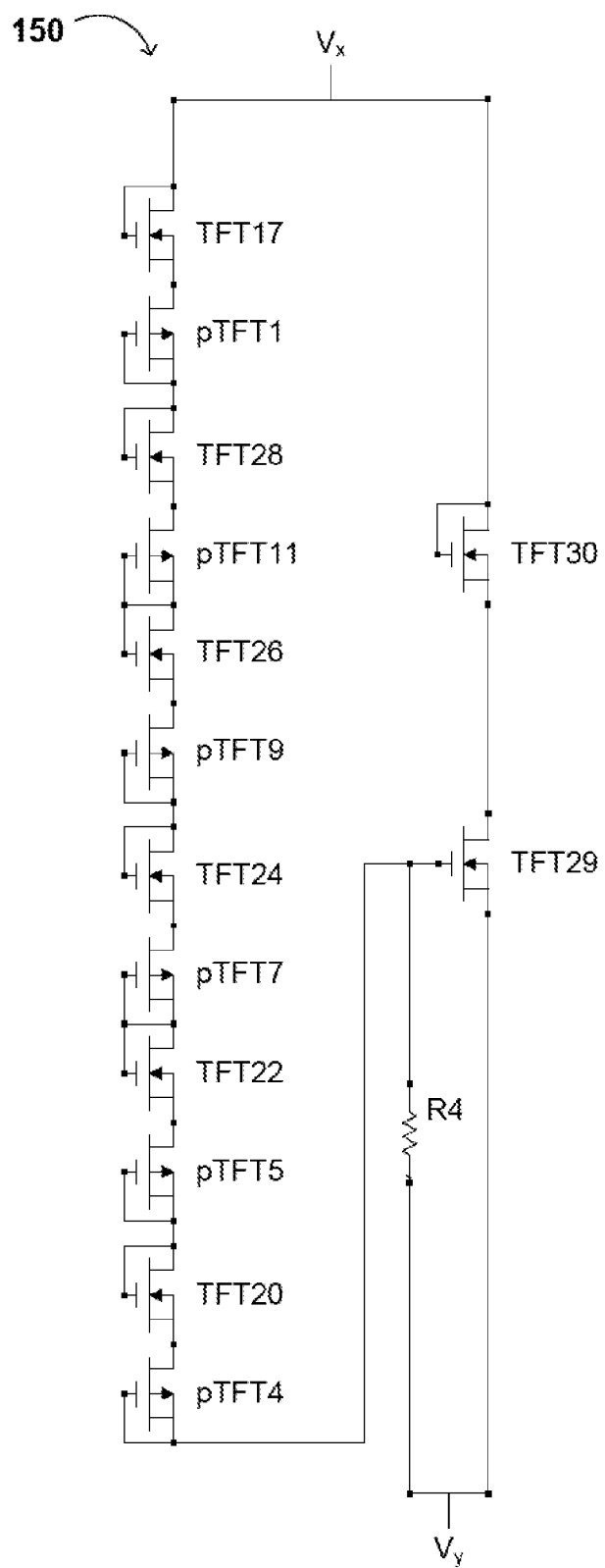

The circuit of FIG. 5C is an exemplary clamp circuit 150 comprising six pairs of diode-connected TFTs as described above. Each pair of diode-connected TFTs of the circuit comprises a PMOS TFT and a NMOS TFT. Further, as explained above, the clamp circuit 150 establishes a net voltage drop $V_t$ that is equivalent to the forward voltage drop for a single diode pair times the number of such pairs connected in series. A design similar or identical to the one shown in FIG. 5C has been simulated with promising results.

Exemplary Identification Devices

Figure 6:
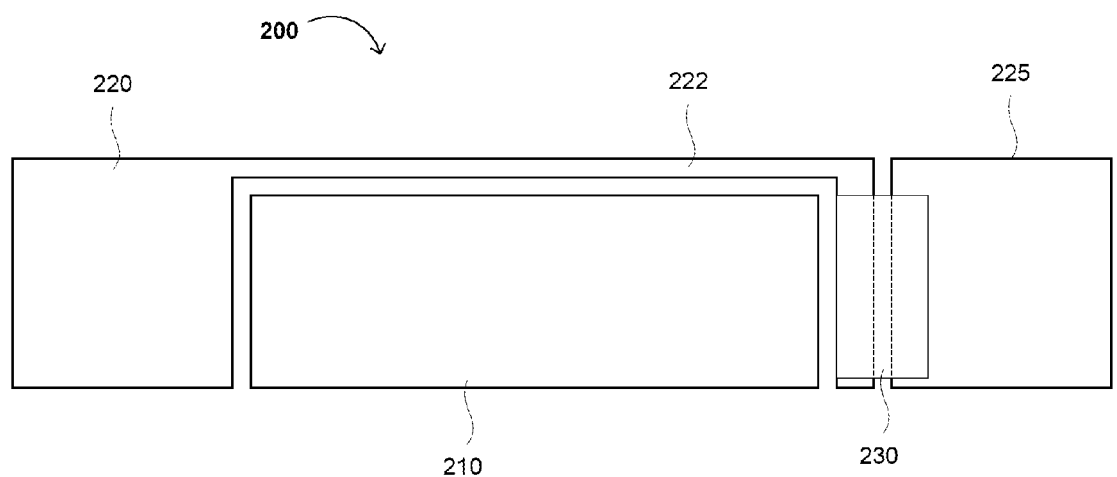
FIG. 6 is an exemplary layout of an RFID tag or device according to the present invention.

In another aspect, the present invention concerns a layout for HF, UHF, RFID and/or EAS devices that includes various component regions, such as the exemplary device of FIG. 6. FIG. 6 shows an exemplary layout for device 200, including logic region 210, antenna regions 220 and 225, and charge pump area 230. In embodiments suitable for EAS, HF, UHF and RFID tags, device 200 may have a length of from 5 to 25 mm, preferably 5 to 20 mm, a width of from 1 to 5 mm, preferably 1 to 3 mm, and an overall area of from 5 to 100 mm$^2$, preferably 10 to 50 mm$^2$. In such embodiments (and as will be explained in greater detail below), logic region 210 may further comprise an input/output control portion, a memory or information storage portion, a clock recovery portion, and/or an information/signal modulation portion.

Antenna region 220 is coupled to charge pump region 230 by L-shaped bus 222. A part of charge pump region 230 also overlaps with antenna region 225. Charge pump region 230 is conventionally coupled to antenna regions 220 and 225 by capacitors, diodes and/or interconnects. For example, charge pump region 230 may comprise a plurality of stages, and the capacitors therein may have an area of 100 to 400 square microns per antenna overlap portion (i.e., the portion of charge pump 230 that overlaps with either bus 222 or antenna region 225).

Thus, the invention relates to a high frequency (HF), ultrahigh frequency (UHF), radio frequency identification (RFID) or electronic article surveillance (EAS) device, comprising (a) an antenna and/or inductor; (b) a rectifier, configured to convert a radio frequency signal received by said antenna and/or inductor into power; (c) the present alternating current clamp circuit, configured to limit a voltage of the radio frequency signal; and (d) logic configured to recover a clock signal from the radio frequency signal and generate an identification signal. In general, said antenna and/or inductor comprises first and second coils, respectively coupled to first and second rectifier input nodes, and the alternating current clamp circuit is coupled between said first and second rectifier input nodes.

Figure 7:
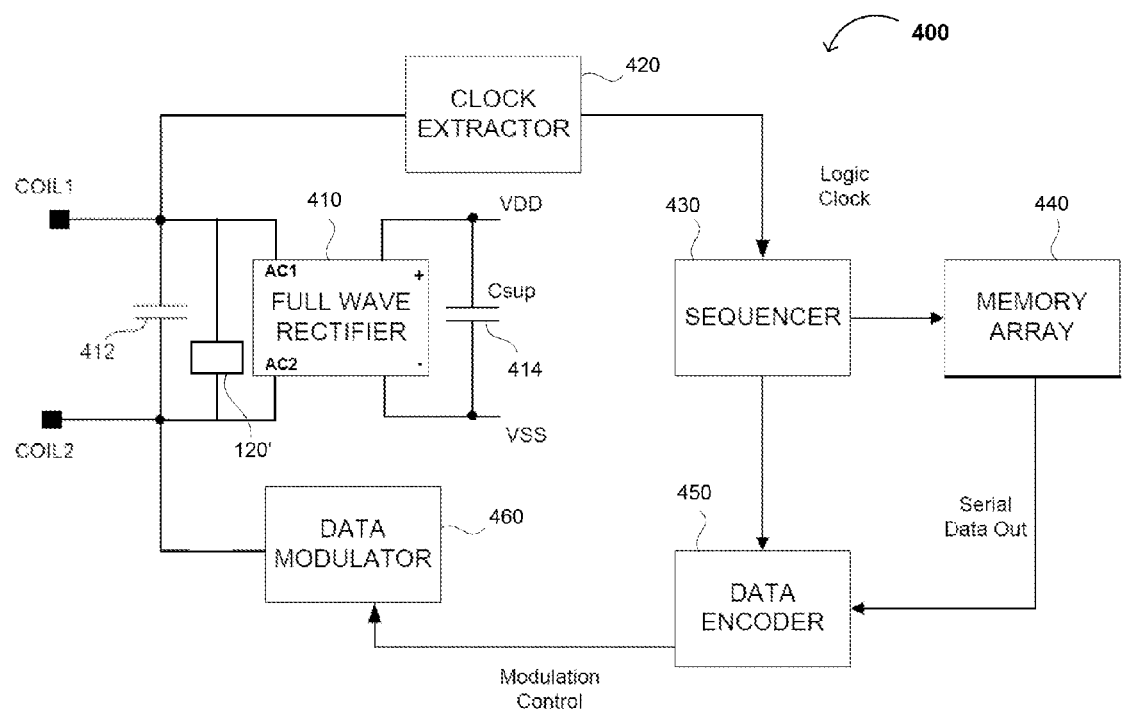
FIG. 7 is a block diagram for an exemplary RFID tag or device that contains the present clamp circuit.

A block diagram of an exemplary RFID tag is shown in FIG. 7. The RFID tag comprises first and second antenna/inductor coils COIL1 and COIL2 (corresponding to antenna regions 220 and 225 in FIG. 6), rectifier 410, clock extractor 420 and sequencer 430 (which may correspond to the clock recovery portion in logic region 210 in FIG. 6), a memory array 440, and data encoder 450 and data modulator block 460. The AC clamp circuit 120' of the present invention (e.g., as depicted in FIGS. 5B and/or 5C) is located across inputs AC1 and AC2 (largely corresponding to differential terminals or signal transmission lines AC+ and AC− in FIG. 5B), and it generally functions as described above to limit the voltage differential and/or voltage excursions on the inputs to full wave rectifier 410 and/or across capacitor 412. Limiting such voltage differentials and/or voltage excursions protects the circuits and/or components coupled to antenna/inductor coils COIL1 and COIL2, and may help to keep the frequency of the received signal within a predefined range, thereby increasing the likelihood of positive identifications.

These circuit blocks can be constructed from thin film device structures, including the devices described herein and in U.S. Provisional Pat. Appl. No. 60/697,599, the relevant portions of which are incorporated herein by reference), as well as in other U.S. patent applications cited herein and/or using the technology described in other U.S. patent applications cited herein. For example, rectifier 410 may have a voltage doubler configuration, and may comprise thin film diode structures formed from a silane ink (such as those shown in FIGS. 2A-3C) for UHF or HF devices. Alternatively, HF devices may use diode-connected TFTs, as shown in FIGS. 1A-1C and 4A. Such thin film devices made from one or more silicon-containing layers with mobilities of >10 cm$^2$/vs in the diode transport direction, doping in the range of $10^{17}$-$10^{20}$ cm$^{-3}$, and contact resistances on the order of $10^{-5}$ ohm-cm$^2$ support rectification in the GHz regime, of sufficient efficiency to power an RFID circuit. Demodulation of clock and data signals, encoded on the carrier RF signal, can be achieved with simple voltage detectors made from thin film diodes or diode connected TFTs as described herein. Signal extraction circuitry may further include one or more filters (e.g., conventional RC circuits) and one or more capacitors (which may be tuned as described in one or more other applications listed herein).

The memory array 440 may comprise a simple read-only memory (ROM), provided by a digital resistive network and defined during the fabrication process. Alternatively, one-time programmable (OTP) ROM may comprise a conventional fuse or anti-fuse structure, and nonvolatile EEPROM in thin film form may comprise a TFT having a floating gate therein. Programming and erasing circuitry (and devices configured to withstand programming and erasing voltages) can also be designed conventionally and manufactured largely as described herein and/or in another application as listed herein (e.g., U.S. Provisional Pat. Appl. No. 60/697,599).

The data modulator 460 may be implemented using load modulation with a shunt transistor in parallel with a resonant capacitor (not shown). When a modulator TFT in enhancement mode made using a silane ink is on, the LC coil that forms part of the tag antenna and that is connected to the modulator 460 would be shorted. This dramatically reduces the Q of the circuit and the coupling to the reader coil. When the modulator TFT is switched sufficiently 'off,' the Q of the LC coil is restored. In this way, a modulation signal can be passed from the tag to the reader. For UHF devices, similar effects also vary the scattering cross-section of the antenna and modulate the backscatter signal to the reader. Alternatively, to reduce potential power losses, it may be advantageous to use a varactor-based modulation that shifts the imaginary part of the impedance of the UHF antennae using either a MOS capacitor device or a varactor diode that can be formed using the TFT and diode processes described herein for rectifier and/or demodulator diodes.

The present clamp circuit 120' may control the voltage swings and/or excursions on the output of the data modulator 460 (generally in combination with a parallel capacitor, or one of capacitors 412 or 414) to lower the resistivity of the tag. Also, a further function of clamp circuit 120' may include increasing the power absorption in the tag, as provided by rectifier 410.

CONCLUSION/SUMMARY

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A circuit, comprising:
   a) an NMOS diode having at least one printed or laser-written structure therein;
   b) a PMOS diode having at least one printed or laser-written structure therein, the PMOS diode being in series with the NMOS diode between first and second complementary nodes or first and second signal lines of a differential signal path; and
   c) a metal wire connecting the NMOS diode to the PMOS diode in series.

2. The circuit of claim 1, wherein said NMOS diode comprises an NMOS thin film transistor (TFT) and said PMOS diode comprises a PMOS TFT.

3. The circuit of claim 2, wherein said metal wire electrically connects a gate and a source/drain region of said NMOS TFT with a gate and a source/drain region of said PMOS TFT.

4. The circuit of claim 1, wherein said NMOS diode comprises a first Schottky diode having a printed or laser-written n-doped semiconductor layer, and said PMOS diode comprises a second Schottky diode having a printed or laser-written p-doped semiconductor layer.

5. The circuit of claim 4, wherein said metal wire electrically connects said n-doped semiconductor layer and said p-doped semiconductor layer.

6. The circuit of claim 1, wherein said NMOS diode comprises an n-dope, semiconductor layer, and said PMOS diode comprises a p-doped semiconductor layer, each of said n-doped and p-doped semiconductor layers having a substantially uniform dopant distribution along substantially the entire thickness thereof while in an amorphous phase.

7. A clamp circuit, comprising a plurality of the circuits of claim 1, in series between said first and second complementary nodes.

8. The clamp circuit of claim 7, further comprising a shunt transistor having a gate receiving an output from one of said NMOS and PMOS diodes, a source coupled, to one of said first and second complementary nodes and a drain coupled to the other of said first and second complementary nodes.

9. The clamp circuit of claim 8, further comprising a resistor coupled between one of said first and second complementary nodes and the gate of the shunt transistor.

10. An alternating current clamp circuit, comprising:
   a) a first circuit of claim 8, coupled between said first and second complementary nodes; and
   b) a second circuit of claim 8, coupled between said first and second complementary nodes in parallel with said first circuit, but with a polarity opposite of said first circuit.

11. The alternating current clamp circuit of claim 10, wherein the first and second complementary nodes comprise a differential signal transmission line.

12. The circuit of claim 11, wherein the first and second nodes each comprise a printed or laser-patterned metal wire.

13. A high frequency (HF), ultrahigh frequency (UHF), radio frequency identification (RFID) or electronic article surveillance (EAS) device, comprising:
   a) an antenna and/or inductor;
   b) a rectifier, configured to convert a radio frequency signal received by said antenna and/or inductor into power;
   c) the alternating current clamp circuit of claim 10, configured to limit a voltage of the radio frequency signal; and
   d) logic configured to recover a clock signal from the radio frequency signal and generate an identification signal.

14. The device of claim 13, wherein the alternating current clamp circuit is coupled between first and second rectifier input nodes.

15. The circuit of claim 1, wherein the metal wire comprises a printed or laser-patterned metal wire.

16. A high frequency (HF), ultrahigh frequency (UHF), radio frequency identification (RFID) or electronic article surveillance (EAS) device, comprising:
   a) an antenna and/or inductor;
   b) rectifier comprising the circuit of claim 1;
   c) an alternating current clamp circuit configured to limit a voltage of the radio frequency signal; and
   d) logic configured to recover a clock signal from the radio frequency signal and generate an identification signal.

17. The circuit of claim 1, wherein said NMOS diode comprises a printed n-doped semiconductor layer, and said PMOS diode comprises a printed p-doped semiconductor layer.

18. The circuit of claim 1, wherein said NMOS diode comprises a laser-written n-doped semiconductor layer, and said PMOS diode comprises a laser-written p-doped semiconductor layer.

19. The circuit of claim 1, wherein one of said NMOS diode and said PMOS diode comprises a printed semiconductor layer, and the other of said NMOS diode and said PMOS diode comprises a laser-written semiconductor layer.

20. A circuit, comprising:
 a) an NMOS diode having at least one printed or laser-written structure therein configured to receive a first voltage;
 b) a PMOS diode having at least one printed or laser-written structure therein configured to receive a second voltage different from the first voltage; and
 c) a metal wire connecting the NMOS diode to the PMOS diode in series,
wherein the circuit is configured to provide a relatively stable, constant output voltage between the first and second voltages.

21. The circuit of claim 20, wherein said NMOS diode comprises an NMOS thin film transistor (TFT) and said PMOS diode comprises a PMOS TFT.

22. A method of limiting a first voltage on a first lode, comprising:
 a) receiving a signal on the first node; and
 b) clamping the signal to a second voltage on a second node by passing current through the circuit of claim 21 when a difference between the first and second voltages exceeds a predetermined value.

23. The circuit of claim 21, wherein said metal wire electrically connects a gate and a source/drain region of said NMOS TFT with a gate and a source/drain region of said PMOS TFT.

24. The circuit of claim 20, wherein said NMOS diode comprises a first Schottky diode having an n-doped semiconductor layer, and said PMOS diode comprises a second Schottky diode having a p-doped semiconductor layer.

25. The circuit of claim 24, wherein said metal wire electrically connects said n-doped semiconductor layer and said p-doped semiconductor layer.

26. The circuit of claim 24, wherein said n-doped semiconductor layer comprises a first semiconductor layer having a first n-type dopant concentration, said first Schottky diode further comprises a second semiconductor layer thereon having a second n-type dopant concentration different from that of the first n-doped semiconductor layer, said p-doped semiconductor layer comprises a third semiconductor layer having a first p-type dopant concentration, and said second Schottky diode further comprises a fourth, semiconductor layer having a second p-type dopant concentration different from that of the first p-doped semiconductor layer.

27. A circuit, comprising:
 a) an NMOS diode comprising a first metal layer and an n-doped semiconductor layer, having at least one structure therein formed from a first liquid phase ink containing a silane and/or silicon nanoparticles;
 b) a PMOS diode comprising a second metal layer and a p-doped semiconductor layer, having at least one structure therein formed from a second liquid phase ink, the second liquid phase ink being the same as or different from the first liquid phase ink; and
 c) a metal wire connecting the NMOS diode to the PMOS diode in series.

28. The circuit of claim 27, wherein said NMOS diode comprises an NMOS thin film transistor (TFT) and said PMOS diode comprises a PMOS TFT.

29. The circuit of claim 28, wherein said metal wire electrically connects a gate and a source/drain region of said NMOS TFT with a gate and a source/drain region of said PMOS TFT.

30. The circuit of claim 27, wherein said NMOS diode comprises a first Schottky diode having an n-doped semiconductor layer, and said PMOS diode comprises a second Schottky diode having a p-doped semiconductor layer.

31. The circuit of claim 30, wherein said metal wire electrically connects said n-doped semiconductor layer and said p-doped semiconductor layer.

32. The circuit of claim 30, wherein said n-doped semiconductor layer comprises a first semiconductor layer having a first n-type dopant concentration, said first Schottky diode further comprises a second semiconductor layer thereon having a second n-type dopant concentration different from that of the first n-doped semiconductor layer, said p-doped semiconductor layer comprises a third semiconductor layer having a first p-type dopant concentration, and said second Schottky diode further comprises a fourth semiconductor layer having a second p-type dopant concentration different from that of the first p-doped semiconductor layer.

* * * * *